United States Patent
Varain et al.

(10) Patent No.: US 12,138,989 B2
(45) Date of Patent: Nov. 12, 2024

(54) DEVICE FOR DRIVING A COMPRESSOR AND PROCESSES FOR MOUNTING THE DEVICE

(71) Applicant: Hanon Systems, Daejeon (KR)

(72) Inventors: Hendrik Varain, Cologne (DE); Bernadette Goebbels, Cologne (DE); Tim Münch, Cologne (DE)

(73) Assignee: HANON SYSTEMS, Daejeon (KR)

( * ) Notice: Subject to any disclaimer, the term of this patent is extended or adjusted under 35 U.S.C. 154(b) by 400 days.

(21) Appl. No.: 17/634,485

(22) PCT Filed: Nov. 30, 2020

(86) PCT No.: PCT/KR2020/017226
§ 371 (c)(1),
(2) Date: Feb. 10, 2022

(87) PCT Pub. No.: WO2021/118135
PCT Pub. Date: Jun. 17, 2021

(65) Prior Publication Data
US 2022/0332166 A1   Oct. 20, 2022

(30) Foreign Application Priority Data

Dec. 11, 2019   (DE) .................. 10 2019 133 941.3

(51) Int. Cl.
*B60H 1/00*   (2006.01)
*H05K 1/02*   (2006.01)
(Continued)

(52) U.S. Cl.
CPC ....... *B60H 1/00428* (2013.01); *H05K 1/0203* (2013.01); *H05K 1/181* (2013.01);
(Continued)

(58) Field of Classification Search
CPC ...... H05K 1/0203; H05K 1/181; H05K 3/341; F04B 53/08; F04C 29/047; F04C 2240/808; H02K 2211/03; H02K 11/33
See application file for complete search history.

(56) References Cited

U.S. PATENT DOCUMENTS

2018/0048219 A1   2/2018  Im et al.
2019/0323509 A1*  10/2019  Gashi .................... F04D 17/122

FOREIGN PATENT DOCUMENTS

DE   102015202591 A1   8/2015
JP     H07183677 A      7/1995
(Continued)

*Primary Examiner* — Lionel Nouketcha
(74) *Attorney, Agent, or Firm* — Shumaker, Loop & Kendrick, LLP

(57) ABSTRACT

A device for driving a compressor of a vaporous fluid which exhibits a housing with a cooling surface and a power supply arrangement with at least one switching element, at least one PCB, as well as at least one spring element for applying a spring force on the at least one switching element. The switching element is connected to the PCB. The cooling surface and the PCB are arranged relative to one another in a direction z with spacing. The at least one switching element is arranged such that it is in contact with the housing with a first surface in the area of the cooling surface and that the at least one spring element for pressing the switching element against the cooling surface is in contact with a second surface of the switching element.

28 Claims, 6 Drawing Sheets

(51) Int. Cl.
*H05K 1/18* (2006.01)
*H05K 3/34* (2006.01)
*H02K 7/14* (2006.01)

(52) U.S. Cl.
CPC ............... *H05K 3/341* (2013.01); *H02K 7/14* (2013.01); *H05K 2201/10053* (2013.01); *H05K 2201/10265* (2013.01)

(56) References Cited

FOREIGN PATENT DOCUMENTS

| | | | |
|---|---|---|---|
| JP | 2001250895 | A | 9/2001 |
| JP | 2002198477 | A | 7/2002 |
| JP | 2002217343 | A | 8/2002 |
| JP | 2011067064 | A | 3/2011 |
| JP | 2017163096 | A | 9/2017 |
| KR | 20040052354 | A | 6/2004 |
| KR | 20190123217 | A | 10/2019 |

* cited by examiner

DEVICE FOR DRIVING A COMPRESSOR AND PROCESSES FOR MOUNTING THE DEVICE

CROSS-REFERENCE TO RELATED PATENT APPLICATIONS

This patent application is a United States nation phase patent application based on PCT/KR2020/017226 filed on Nov. 30, 2020, which claims the benefit of German Patent Application No. 10 2019 133 941.3 filed on Dec. 11, 2019, the entire disclosures of which are hereby incorporated herein by reference.

TECHNICAL FIELD

The present invention relates to a device, in particular an electric motor, for driving a compressor to compress a vaporous fluid, specifically a refrigerant. The device is produced with a housing that features a cooling surface and a power supply arrangement. The arrangement exhibits at least one switching element, a PCB, as well as a spring element for applying a spring force on the switching element. The switching element is connected to the PCB. The compressor can be used in the refrigerant circuit of a motor vehicle air-conditioning system. The present invention also relates to processes for mounting the device used to drive the compressor of a vaporous fluid.

BACKGROUND ART

Compressors known from the state of the art for mobile applications, in particular as air-conditioning systems in motor vehicles, that are used for conveying refrigerant through a refrigerant circuit, also known as refrigerant compressors, are often constructed as piston compressors with variable displacement or as scroll compressors irrespective of the refrigerant used. The compressors are driven either via a belt pulley or electrically.

Alongside the electric motor for driving the respective compression mechanism, an electrically driven compressor also exhibits an inverter for driving the electric motor. The inverter is used to convert the direct current (DC) supplied by a vehicle battery into alternating current (AC), which is then fed to the electric motor through electrical connections.

The inverter exhibits a PCB that contains switching elements, such as power transistors, which together form a compressor switching device. The power transistors of an inverter, also known as power switches, generate heat as a result of switching losses and conduction losses that needs to be dissipated by the transistors. The dissipated heat, in particular of an electrically driven refrigerant compressor, should ideally be transferred to the refrigerant. The power transistors are advantageously to be arranged on an outer side of the compressor housing such that they are in contact with the housing and can therefore conduct heat. The power transistors should be connected to the housing in the section of the housing with the lowest temperature, which is regularly located in the area of the intake port where the refrigerant flows into the compressor.

In the following, the section of the housing with the lowest temperature is also referred to as the cooling surface/area of the housing, specifically of the motor housing. The power transistors can be attached directly to the cooling surface in such a way that they conduct heat.

In the design of conventional modular inverters, the power transistors are arranged on an additional support element, which itself is then attached to the cooling surface of the housing together with the power transistors. In this case, an additional wall of the support element is provided between the power transistors and the cooling surface of the housing. The surface of the wall on the support element is in contact with the cooling surface of the housing, which leads to a deterioration in heat dissipation from the transistor in comparison with an arrangement where the transistor is in direct contact with the cooling surface of the housing.

Each power transistor is to be thermally contacted either to the cooling surface of the housing or to the wall of the support element.

A good thermal contact can, for example, be produced using matched surface roughnesses. However, air pockets between the respective power transistor and the cooling surface of the housing or the wall of the support element must in particular be avoided, as these can reduce heat transfer between the components.

In conventional units, thermal interface materials such as thermal paste or foils are used to guarantee good thermal contact and avoid the aforementioned air pockets. In addition to this, a certain mounting pressure can be applied to the power transistors, which then also presses on the cooling surface of the housing or the wall of the support element. Alongside establishing a good thermal contact, this pressure on the transistors also serves to attach the transistors or the inverter to the housing in a way that makes the connection vibration-resistant.

The notion of applying compressive force, which acts in the direction of the cooling surface of the housing or the wall of the support element, through a direct screw connection or a clamped connection, for example using spring elements, is known from the state of the art. The power transistors can be screwed down to the cooling surface of the housing or the wall of the support element.

When mounting the power transistors directly to the cooling surface of the housing, with potential inclusion of thermal interface materials between the power transistors and the cooling surface, the transistors are either screwed down or clamped to the housing. The power transistors are generally screwed down to the cooling surface of the housing. However, screwing the individual power transistors to the cooling surface of the housing leads to extremely high installation costs, not least since each screw needs to be accompanied by a washer for force distribution, as well as a ring of insulation. Use of the six power transistors that are typically arranged in the known inverters leads to a very large number of individual components.

In the alternative, modular design of the inverter, the power transistors are attached to the wall of the support element. After the respective attachment of the power transistors, a PCB is then attached. The connections of the transistors are arranged such that they are plated through the PCB and then soldered to the PCB.

Since the PCB is fitted as the final component during manufacture of the electrically driven compressor with power transistors arranged directly on the cooling surface of the housing, the selective soldering of the power transistors to the PCB is also performed directly on the compressor housing. The processes of mounting and soldering the PCB to the already fitted housing are both very complex and time consuming from a production perspective, for example since the power transistors are connected to the PCB by soldering after being screwed down, meaning that access to the screws is covered. The screws are arranged below the PCB. In order to arrange the screws in such a way that they also remain accessible when the PCB is fitted and allow the power transistors to be screwed down above the PCB, each screw can be arranged such that it is fed through a sleeve, in particular a metal sleeve, although this leads to additional costs and greater assembly expenses.

Use of a plastic frame to press the power transistors against the cooling surface of the housing is also known. The contact pressure is transferred via the plastic frame and onto the power transistors. The power transistors are premounted on the plastic frame, meaning that they no longer need to be soldered to the compressor housing. However, depending on time and temperature, the force characteristic inside the plastic frame can cause the plastic to deform, which in turn reduces the force acting on the power transistors and means that the minimum contact pressure required for pressing the power transistors against the cooling surface of the housing is potentially no longer guaranteed. The contact pressure is directly related to the thermal output that is transferred from the power transistor to the cooling surface of the housing. If the contact pressure is reduced too much, this can lead to one or more power transistors overheating and thereby to a malfunction of the electronics and consequently also the compressor.

In addition to this, the solder points are to be produced such that they are free of any mechanical tension, which is not the case with inverters that are premounted using clamps and plastic frames.

For heat dissipation from the power transistor to the cooling surface of the housing, however, the alternative modular design of the inverter (wherein the power transistors are mounted on the wall of the support element, which is generally preferred from a production perspective) requires an additional heat passage through the wall of the support element, as well as an additional heat transfer section between the support element and the cooling surface of the housing, which impairs heat transfer from the transistor to the cooling surface.

SUMMARY

The object of the invention lies in provision and improvement of an inverter for a device used to drive an electrically driven compressor of a vaporous fluid, in particular an electric motor, that can also be fitted easily and therefore quickly. The focus is on dissipating as much heat as possible from the power transistors through optimum heat transfer, in particular transferring the heat to the fluid that is to be compressed in the compressor. The device should employ a basic design and therefore be easy to produce in order to minimize manufacturing costs. The arrangement should facilitate secure operation of the device and a maximum service life.

The task is solved by the subject matter as disclosed herein.

The task is resolved by a device according to the invention for driving a compressor of a vaporous fluid, in particular an electric motor. The device is produced with a housing that features a cooling surface and a power supply arrangement, in particular an inverter. The arrangement exhibits at least one switching element, at least one PCB, as well as at least one spring element for applying a spring force on the at least one switching element. The switching element is firmly connected to the PCB, in particular soldered. The cooling surface and the PCB are arranged relative to one another in a direction z with spacing.

According to the design of the invention, the at least one switching element is arranged such that a first surface is in contact with the housing in the area of the cooling surface and that the at least one spring element for pressing the switching element against the cooling surface is in contact with the switching element on a second surface. The PCB and the at least one spring element can be attached to the housing independently of one another using fixings. The at least one spring element is arranged such that it can move freely between the PCB and the cooling surface in a movement direction along at least one guide element.

A second surface of the switching element is advantageously produced such that it is positioned opposite the first surface of the switching element, which is itself aligned towards the cooling surface of the housing, in the direction z. The first surface and the second surface of the switching element are preferably aligned parallel to one another.

The at least one spring element is, in particular, arranged between the PCB and the at least one switching element. The switching element is preferably produced as a power transistor.

As per a further embodiment of the invention, the at least one guide element is produced as a component of a frame element that is arranged between the cooling surface of the housing and the PCB or as a component of the spring element.

An advantage of the invention lies in the fact that the movement direction of the at least one spring element is essentially aligned vertically in the direction z to a plane of the PCB and a plane of the cooling surface on the housing. The planes of the PCB and the cooling surface are aligned parallel to one another and are spaced apart.

As per a preferred embodiment of the invention, the at least one guide element exhibits a shape that is elongated in the direction z with one first end and one second end. The guide element is preferably aligned in the direction z. Two guide elements can be provided for the at least one spring element. In an embodiment with multiple, in particular at least two, spring elements, two guide elements can be assigned to each spring element.

In the first alternative embodiment, the first end of the at least one guide element is advantageously attached to the frame element as a component of the frame element. The guide element can exhibit at least one snap-in element on its second end for engaging the spring element with the frame element.

In the second alternative embodiment of the guide element as a component of the frame element, the first end of the guide element is preferably attached to the frame element. The guide element can exhibit at least one snap-in element on its second end for engaging the spring element on the PCB.

In each case, the snap-in element is preferably produced in the form of a barb that allows, in particular makes it easier for, the spring element to be attached onto the guide element or the guide element to be inserted through an opening in the PCB, allows a movement of the spring element along the guide element or the guide element in the opening on the PCB and prevents the spring element from disengaging with the guide element or the PCB, meaning that the spring element has a captive connection to the guide element or the PCB.

As per an advantageous embodiment of the invention, the at least one guide element exhibits, on a plane that runs vertically to the direction z, a rectangular or round cross-section, in particular a circular cross-section, or, in a plane that runs in the directions x, z, a U shaped cross-section with an open side on the second end. The directions x, z are aligned orthogonally to one another.

As per a further embodiment of the invention, the frame element is produced with pass-through openings for passing through fixings to attach to the housing. The pass-through openings are preferably aligned in the direction z. The fixings are advantageously produced as screws, meaning that the frame element, in particular together with the PCB, is attached to the housing using screw connections.

The frame element is preferably produced with at least one mounting recess for mounting the at least one switching element. The mounting recess is provided on a side of the frame element that faces the cooling surface of the housing. With an arrangement of multiple, in particular at least two, switching elements, one mounting recess is preferably produced for each switching element.

The frame element advantageously exhibits feed-through openings for passing through connections of the at least one switching element. The feed-through openings are provided on side a of the frame element that faces the PCB.

The frame element is in particular produced from a plastic.

According to another preferred embodiment of the invention, the at least one spring element exhibits the form of a small plate with at least one curved strip that projects from a base area. The curvature of the at least one strip is aligned with a contact area, preferably produced as a convex surface, in the direction of the at least one switching element and is in contact with the switching element in the contact area. In an embodiment with multiple, in particular at least two, switching elements, one strip of a spring element can be assigned to each switching element. The strips are preferably aligned in a common direction.

An advantage of the invention lies in the fact that the at least one spring element is produced with at least one mounting element for attaching to the at least one guide element or with the at least one guide element for attaching to the PCB.

The mounting element and/or the guide element preferably exhibit the form of a strip with one first end and one second end. The first end is preferably attached to the base area of the spring element. In an embodiment with in particular two mounting elements or two guide elements, these are advantageously each arranged on opposing end faces of the spring element and can be aligned in a common direction, which in particular corresponds to the direction in which the curved strips are set down on the switching element.

As per the first alternative embodiment of the spring element with the at least one mounting element for attaching to a guide element, the second end of the mounting element is preferably produced as a free end with an opening, in particular in the form of an eyelet, specifically a fully enclosed eyelet, for passing through the guide element. The opening can exhibit a circular or rectangular, in particular square, cross-section that matches the cross-section of the guide element.

As per the second alternative embodiment of the spring element with the at least one guide element for attaching to the PCB, the second end of the guide element is preferably produced as a free end with a snap-in element for passing through an opening produced in the PCB.

The spring element preferably exhibits pass-through openings that are produced in the base area for passing through attachment elements for attaching to the housing. The pass-through openings are preferably aligned in the direction z. The fixings are advantageously produced as screws, meaning that the spring element is attached to the housing using screw connections.

The spring element is preferably produced from a elastically deformable material, in particular a metal.

The task is also solved by using processes as per the invention for mounting the device used to drive a compressor of a vaporous fluid, in particular an electric motor. The processes exhibit the following steps:

Mounting a power supply arrangement, in particular an inverter, to a housing of the device or as a module on a mounting device with Arrangement of at least one switching element with a first surface on a cooling surface of the housing or on the mounting device, wherein connections of the switching element project from the switching element in a direction z and in an opposite direction to the second surface of the switching element that faces the first surface, wherein the direction z essentially runs orthogonally to the cooling surface and the surfaces of the switching element, Arrangement of at least one spring element on a frame element or on a PCB, meaning that the spring element can be moved with guidance in a movement direction relative to the frame element or to the PCB in the direction z on at least one guide element, Arrangement of the frame element or the PCB with the at least one spring element pointing in the direction z in such a way that the switching element is arranged between the cooling surface and the frame element or the PCB, wherein a contact area on the spring element is brought into contact with the second surface on the switching element and then slid along guide element in the direction z without any elastic deformation, Arrangement of the PCB on the frame element in the direction z for the embodiment of the device with the frame element, Insertion of the connections of the switching element through openings produced in the PCB, Attachment of the PCB to the housing, in particular to the cooling surface, or to the mounting device using first attachment elements.

Soldering of the connections of the switching element to the PCB free of any mechanical tension and connecting the components to produce a module, When mounting the arrangement as a module on the mounting device, release of the first attachment elements and removal of the module from the mounting device, as well as arrangement of the module on the housing with the first surface of the switching element on the cooling surface, as well as attachment of the PCB to the housing using the first attachment elements, as well as Attachment of the spring element with a base area on the cooling surface using second attachment elements, wherein the spring element is elastically deformed and a spring force or compressive force is thereby generated and applied to the switching element such that the switching element is pressed flat against the cooling surface in the direction z.

In the following, the section of the housing with the lowest temperature is also referred to as the cooling surface/area of the housing, specifically of the motor housing. The power transistors can be attached directly to the cooling surface in such a way that they conduct heat.

An advantage of the invention lies in the fact that connections of the switching element are arranged such that they are plated through the PCB and then soldered to the PCB. The modularity in particular allows the PCB to be soldered to the switching elements even without the presence of the housing.

As per a further embodiment of the invention, when mounting the arrangement with the frame element, the spring element is attached to a guide element of the frame element with a mounting element, in particular produced as an eyelet, in the movement direction. The mounting element can be attached captively to the guide element of the frame element by being snapped into place on a snap-in element.

As per a preferred embodiment of the invention, the frame element is placed over the switching elements in such a way that the connections of the switching element are guided through feed-through openings produced in the frame element in the direction z, projecting from the frame element, and the switching elements are arranged such that they are integrated inside mounting recesses produced in the frame element.

When mounting the arrangement as a module on the mounting device, the base area of the spring element can be attached to the mounting device using the second attachment elements before the step of soldering the connections on the switching element to the PCB. The spring element is elastically deformed and a spring force or compressive force is generated and applied to the switching element in such a way that the switching element is pressed against the mounting device in the direction z. The second attachment elements are released again before removing the module from the mounting device.

According to another advantageous embodiment of the invention, the PCB and/or the spring element are screwed down to the housing and/or the mounting device using the attachment elements.

When the device is mounted, the spring element is in contact with the switching element in an elastically deformed way. As a result of the pressure applied by the elastic deformation of the spring element on the switching element, the switching element is pressed against the cooling surface of the housing in such a way that optimum heat transfer from the switching element to the cooling surface is guaranteed.

At least one thermal interface material, such as a thermal paste or foil, is preferably arranged between the switching element and the cooling surface of the housing.

The advantageous embodiment of the invention allows the device to be used to drive a compressor, in particular an electric motor, for compressing a vaporous fluid for a compressor of a refrigerant in a refrigerant circuit of a motor vehicle air-conditioning system.

With the fixed or modular arrangement, specifically of an inverter for an electric motor of a refrigerant compressor, in connection with use of the spring force of metallic spring elements, above all the thermal influence, in particular of the switching elements or power transistors, is significantly reduced over devices known from the state of the art.

Since the power transistors are in direct thermal contact with the cooling surface, this leads to improved cooling capacity of the power transistors. The thermal contact, and thereby also the heat transfer process, are both improved with the arrangement of the at least one thermal interface material between the power transistor and the cooling surface of the housing.

The device according to the invention for driving a compressor of a vaporous fluid and the processes for mounting the device collectively exhibit various other advantages:

Optimum heat transfer, in particular to the fluid that is to be compressed in the compressor, with the maximum thermal energy that can be dissipated by the power transistors, Simple design and handling of the arrangement, facilitating easy production and therefore low manufacturing costs, Easy and time-saving assembly of the arrangement and mounting of the arrangement to the housing, The solder points on the power transistors are also not subjected to mechanical stress during the assembly process and are therefore free of any mechanical tension, Spring elements deliver the requisite force for pressing the power transistors against the cooling surface of the housing throughout the entire service life at various temperatures and thereby regardless of the temperature.

BRIEF DESCRIPTION OF DRAWINGS

Further details, features and benefits of embodiments of the invention result from the following description of embodiment examples with reference to the accompanying drawings. These display the following.

DETAILED DESCRIPTION OF AN EMBODIMENT

Figure 1A:
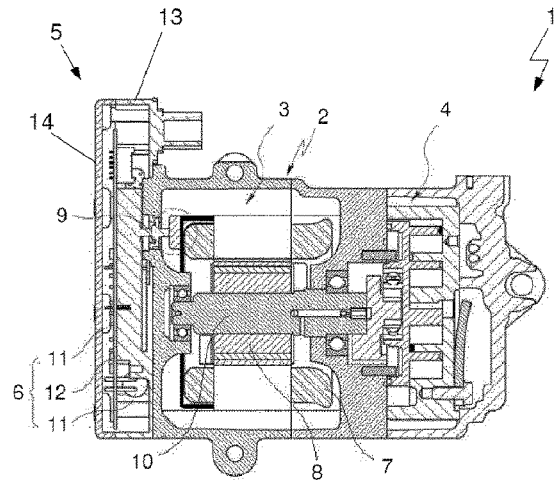
FIGS. 1A and 1B: A sectional view and perspective view of an electrically driven compressor with a device, in particular an electric motor, for driving a compression mechanism and an arrangement of an inverter with an exploded view of the inverter arrangement.

FIG. 1 shows a sectional view of an electrically driven compressor 1 with an electric motor 3 arranged in a housing 2 as a device 3 for driving a compression mechanism 4 and an arrangement 5 of an inverter. The electric motor 3 is powered via a switching device 6 of the arrangement 5.

The electric motor 3 exhibits a stator 7 with an essentially hollow cylinder-shaped stator core and coils wound on the stator core, as well as a rotor 8 arranged inside the stator 7. The rotor 8 is set into rotation when electrical energy is supplied to the coils of the stator 7 via a connection arrangement 9. The connection arrangement 9 is produced on an end face of the stator 7 and exhibits a large number of electrical connections.

The rotor 8 is arranged coaxially inside the stator 7 and in such a way that it can be rotated around a rotary axis. A drive shaft 10 can be produced integrally with the rotor 8 or as a separate element.

The electric motor 3 and the compression mechanism 4, produced in the form of a scroll compressor with one fixed and one orbiting scroll, are arranged inside a volume enclosed by the housing 2. The housing 2 comprises a first housing element for mounting the electric motor 3 and a second housing element for mounting the compression mechanism 4, preferably produced from a metal, in particular an aluminum.

The orbiting scroll of the compression mechanism 4, in which the vaporous fluid, specifically a refrigerant, is compressed, is driven via the drive shaft 10 that is connected to the rotor 8 of the electric motor 3. As per an embodiment not shown, the compression mechanism can, for example, also be produced with a wobble plate.

The switching device 6 for controlling operation of the electric motor 3 exhibits a PCB 12 that is produced with various switching elements 11. Various control circuits and components are premounted on the PCB 12 with electrical connections and powered by an external power source via a power cable.

The PCB 12 with the switching elements 11 is arranged inside a support element 13 of the inverter arrangement 5 and fixed to the support element 13. The arrangement 5 is sealed off by a cover element 14.

Figure 1B:
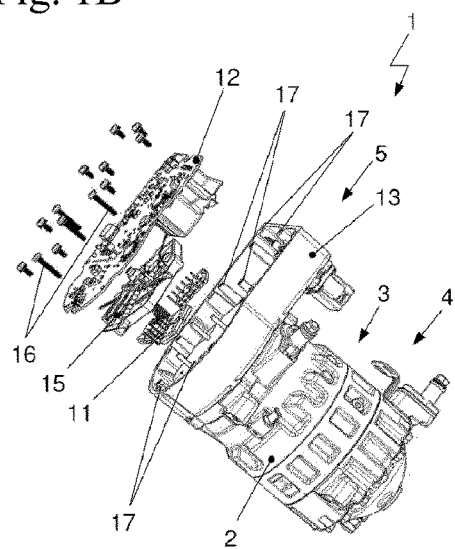

FIG. 1B shows a perspective view of the electrically driven compressor 1 with the electric motor 3 arranged in the housing 2 as a device 3 for driving the compression mechanism 4 and the inverter arrangement 5, as well as an exploded view of the standard arrangement 5 or the open arrangement 5 of the inverter (without a cover element).

The arrangement 5 is produced with a frame element 15 that is configured to mount the switching elements 11 and spring elements 18 (not shown), as well as being arranged between the switching elements 11 and the PCB 12. The PCB 12 and the frame element 15 are attached, in particular screwed down, to the housing 2 or the support element 13 using attachment elements 16, preferably produced as screw connections. The attachment elements 16 reach into and engage in mounting holes 17 that are provided in the housing 2 or in the support element 13.

The support element 13, produced as a mounting element and a housing element, exhibits a pass-through opening that is arranged and aligned in the direction of a cooling surface on the housing 2 when the compressor 1 is mounted. The support element 13, preferably produced from a metal, is in contact with the housing 2.

The support element 13 also exhibits a perimeter wall that is aligned essentially orthogonally to the plane of the pass-through opening and is in contact with the housing 2 via a first end face. On a second end face of the perimeter wall, aligned distally to the first end face, the arrangement 5 can be sealed off with the cover element (not shown) that is in contact with the perimeter wall of the support element 13 when the arrangement 5 is fitted. A sealing element can be arranged between the second end face of the perimeter wall of the support element 13 and the cover element in order to seal off the arrangement 5. The shape of the sealing element exhibits the contour of the second end face of the perimeter wall of the support element 13, meaning that the shape of the sealing element and the end face of the perimeter wall of the support element 13 match one another.

The cover element (not shown) is attached to the support element 13 using attachment elements 16, where in the sealing element is arranged between the cover element and the support element 13. The PCB 12, arranged in the volume enclosed by the support element 13 with the cover element (not shown), is also firmly attached to the support element 13 using attachment elements 16. The attachment elements 16 are each introduced into and arranged in mounting holes 17 that are produced in the support element 13. The attachment elements 16 are preferably produced as screw connections with the mounting holes 17.

The PCB 12 is intended for mounting switching elements 11, in particular switching elements produced as power transistors 11, that are firmly connected to the PCB 12 via connections and are arranged in the pass-through opening of the support element 13 and on the cooling surface of the housing 2 when the arrangement 5 is fitted. Spring elements (not shown), held in place by the frame element 15, are arranged between the PCB 12 and the power transistors 11. The connections of the power transistors 11 are guided through feed-through openings provided in the frame element 15.

Figure 2A:
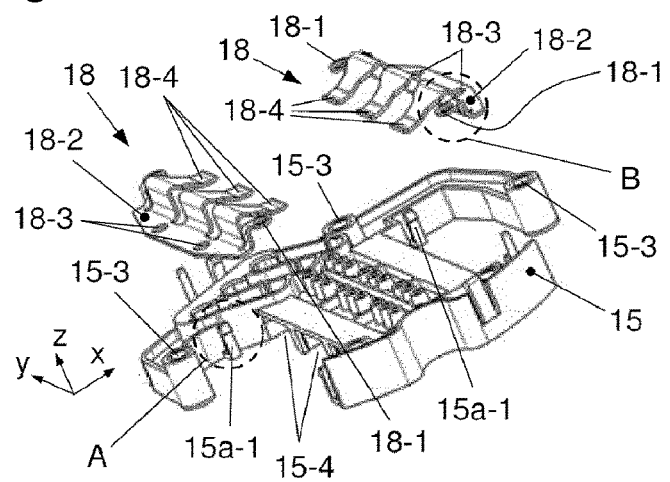
FIG. 2A: A perspective exploded view of a frame element and spring elements of an inverter arrangement.
Figure 2B:
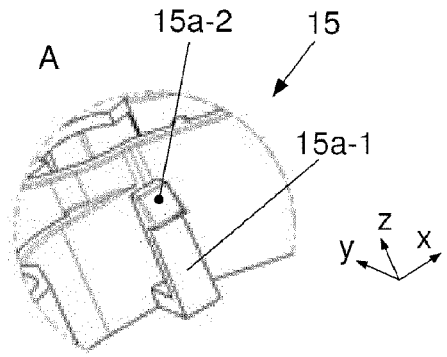
FIGS. 2B and 2C: A perspective view with detailed views of the frame element and a spring element from FIG. 2A, FIGS. 2D and 2E: A perspective view of the frame element with the spring elements from FIG. 2A when fitted.
Figure 2C:
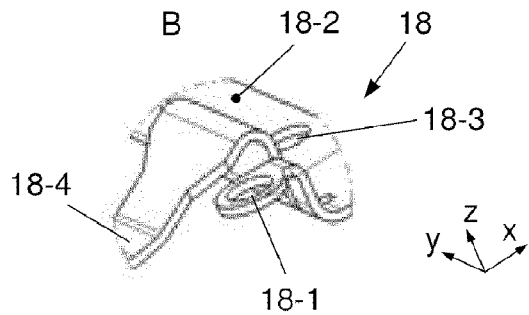
Figure 2D:
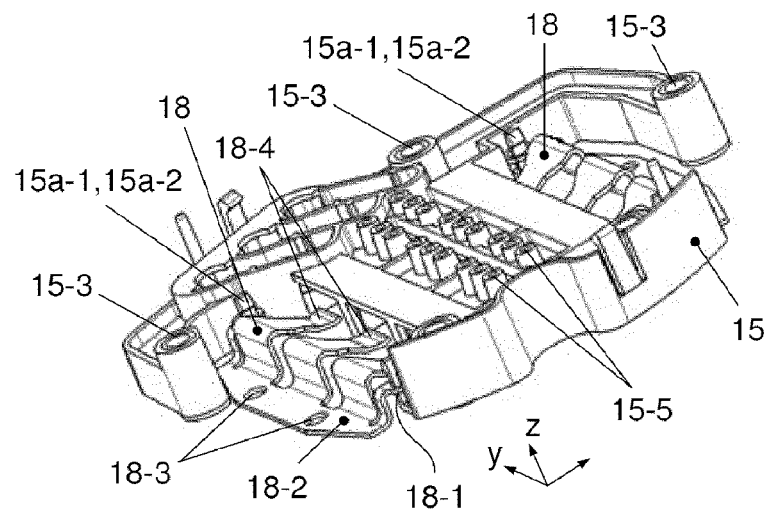
FIG. 2F: A perspective view with a detailed view of the frame element with a spring element from FIG. 2D or FIG. 2E, FIG. 3A: A perspective exploded view of a PCB, the frame element with the premounted spring elements and power transistors of the inverter arrangement, as well as a mounting device or a section of the housing.
Figure 2E:
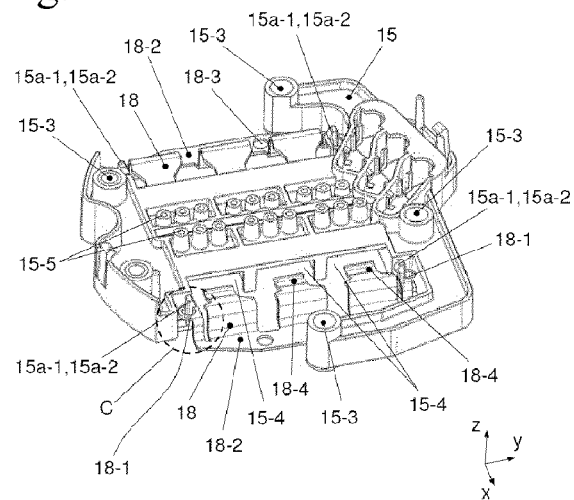
Figure 2F:
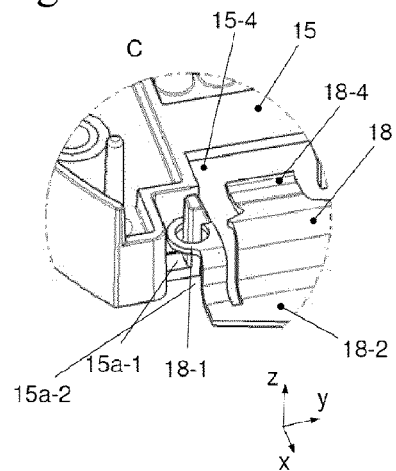

FIGS. 2A to 2F each show a perspective view of a frame element 15, preferably produced from a plastic, as well as spring elements 18 of an inverter arrangement 5. FIG. 2A shows the frame element 15 and spring elements 18 in a exploded view, while FIGS. 2D and 2E show the frame element 15 with spring elements 18 attached to guide elements 15a-1 of the frame element 15. FIGS. 2B and 2C each show detailed views of the frame element 15 or the spring element 18 as per FIG. 2A, while FIG. 2F shows a detailed view of the frame element 15 with a spring element 18 arranged on a guide element 15a-1 from one of the FIG. 2D or 2E.

The frame element 15 exhibits four guide elements 15a-1 for mounting and guiding two spring elements 18, as well as pass-through openings 15-3, for example for attaching the frame element 15 to a housing or a mounting device, in particular a plate-shaped mounting device. Two guide elements 15a-1 are assigned to each spring element 18. The pass-through openings 15-3 are used to guide through attachment elements, which can in particular be produced as bolts or screws.

The frame element 15 also exhibits mounting formations 15-4 for mounting six power transistors (not shown), as well as feed-through openings 15-5 for guiding connections of the power transistors through the frame element 15. The power transistors are laid into the mounting recesses 15-4 during the process of mounting the inverter arrangement 5 and the position of the power transistors is thereby set. One power transistor is assigned to each mounting recess 15-4.

The connections of the power transistors are inserted through the feed-through openings 15-5.

The guide elements 15a-1 are each produced in an elongated form or the shape of a pin. The guide elements 15a-1 are firmly and inseparably, in particular not nondestructively, attached to the frame element 15 on a first end. On a free second end that is produced distally to the first end, the guide elements 15a-1 each exhibit a snap-in element 15a-2. The snap-in element 15a-2 is produced in a shape that is similar to a barb and allows a spring element 18 to be attached over the second end in a first movement direction, which runs opposite to a direction z, wherein the process of attaching the spring element 18 is simplified through use of a cross-sectional area that narrows towards the second end and, after attaching via the snap-in element 15a-2, any movement beyond a predefined range in a second movement direction, which runs in the direction z, which is the opposite direction to the first movement direction, is prevented. After being attached via the snap-in element 15a-2, the spring element 18 is then arranged on the guide element 15a-1 in such a way that it is captive and can move along the guide element 15a-1.

The spring elements 18, preferably produced from a metal, each exhibit a strip-shaped mounting element 18-1 on two end faces that are aligned distally to one another. The mounting element 18-1 is attached to a base area 18-2 on a first end in each case, while a second free end that is produced distally to the first end is produced in the form of an eyelet, in particular a closed eyelet, with a fully enclosed opening. The opening preferably exhibits a circular cross-section.

The spring elements 18 can, for example, be attached to a housing or a mounting device, in particular a plate-shaped mounting device, using pass-through openings 18-3 provided in the base area 18-2 for guiding through attachment elements. The base area 18-2 is arranged on a plane that extends in the directions x and y.

Each spring element 18 is produced with curved strips, which are aligned in the direction of the mounting recesses 15-4 on the frame element 15 or are arranged such that they project into the mounting recesses 15-4. The strips are attached on a first end to the base area 18-2, while second free ends, produced distally to the first ends, each exhibit a contact area 18-4. The contact area 18-4 is produced with a convex surface in the direction of a power transistor (not shown) and is in contact with the power transistor when the inverter arrangement 5 is fitted in order to apply a spring force to the power transistor. One strip of a spring element 18 is assigned to each power transistor.

The second ends of the mounting elements 18-1, produced as eyelets, or the second ends of the curved strips produced with the contact area 18-4 are each deflected in the direction z relative to the base area 18-2 and aligned on a plane defined by the directions x and y.

When mounting the inverter arrangement 5 with the mounting element 18-1, as in particular shown by FIGS. 2E and 2F, the spring element 18 is attached to a guide element 15a-1 with the snap-in element 15a-2, produced as an eyelet, in an opposite direction to the direction z. The spring elements 18 are snapped or clipped into the frame element 15 with the mounting elements 18-1 in the area of the guide elements 15a-1.

The fact that the snap-in element 15a-2 exhibits the shape of a barb with a cross-sectional area that narrows as it moves in the movement direction of the spring element 18 makes it easier to attach, while a movement of the spring element 18 in the direction z beyond a predefined range, which would also lead to the spring element 18 being pulled off the guide element 15a-1, is prevented. The spring element 18 that is attached captively to the guide elements 15a-1, each produced in pairs, is arranged such that it can move along the guide elements 15a-1 in the direction z up to the stop on the snap-in element 15a-2, as well as in the opposite direction to the direction z. The diameter of the opening inside the mounting element 18-1 is greater than the largest diameter of the cross-section of the guide element 15a-1 on the plane that extends in the directions x and y, meaning that free movement of the mounting element 18-1 that encloses the guide element 15a-1 is guaranteed.

Figure 3A:
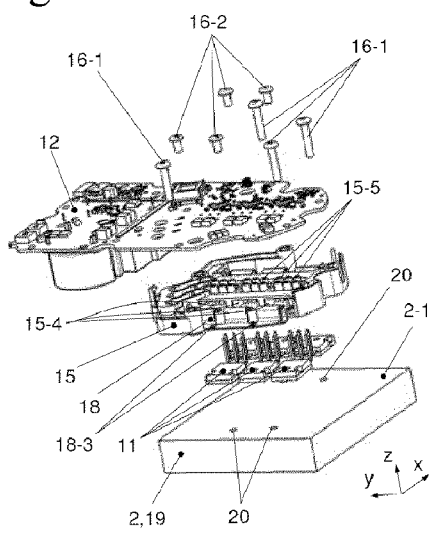
FIG. 3B: A perspective view of the frame element premounted with the PCB on the mounting device with the spring elements of the inverter arrangement and with the power transistors both inserted into and soldered to the PCB.
FIG. 3C: A perspective exploded view of the PCB, the frame element and the power transistors of the inverter arrangement when fitted, as well as the housing of the electric motor and of the compression mechanism with a cooling surface.
Figure 3B:
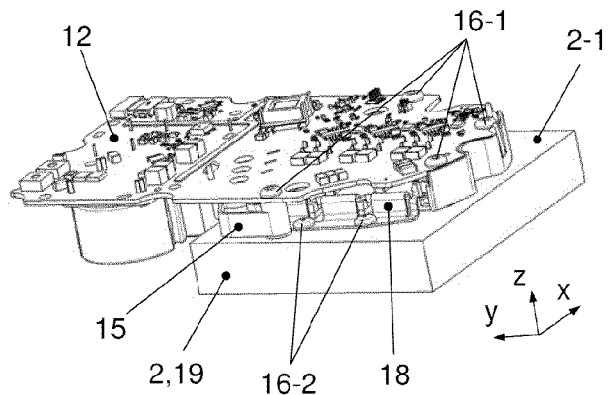

FIG. 3A shows a perspective exploded view of the PCB 12, the frame element 15 with the premounted spring elements 18 and the power transistors 11 of the inverter arrangement 5, as well as a mounting device 19 produced as a plate with first attachment elements 16-1 for attaching the PCB 12 and second attachment elements 16-2 for attaching each of the spring elements 18 to the housing 2 or to a mounting device 19. FIG. 3B shows a perspective view of the frame element 15 that is premounted to the PCB 12 on the mounting device 19 with the spring elements 18 of the inverter arrangement 5 with the power transistors 11 that are inserted into and soldered onto the PCB 12.

During the process of mounting the arrangement 5, the power transistors 11, the frame element 15 with the already premounted spring elements 18 and the PCB 12 are all placed onto the mounting device 19, wherein the mounting of the components can be performed in the specified sequence one after the other or the frame element 15 with the already premounted spring elements 18 and the PCB 12 can be positioned against one another, the power transistors 11 then inserted and finally the mounting device 19 moved into position. The spring elements 18 are clipped into place and attached to the frame element 15 in such a way that a relative movement of the spring elements 18 in the direction z, and thereby in the direction of the force that acts on the power transistors 11 when fitted, is guaranteed until the spring elements 18 are attached, in particular screwed down, to the mounting device 19. The spring elements 18 are not elastically deformed until the spring elements 18 are screwed down to the mounting device 19, meaning that no spring force is generated.

After setting down the power transistors 11 on the mounting device 19, the frame element 5 is placed over the power transistors 11 in such a way that the connections of the power transistors 11 are guided through the feed-through openings 15-5 in the direction z, projecting out of the frame element 5, and the power transistors 11 are arranged such that they are integrated inside the mounting recesses 15-4. The spring elements 18 are slid along the guide elements in the direction z.

The connections of the power transistors 11 that project out of the frame element 15 are then inserted through openings produced in the PCB 12 free of any mechanical tension. The PCB 12 is attached to the mounting device 19, in particular screwed down to the mounting device 19 using the first attachment elements 16-1, with the frame element 15 arranged between the PCB 12 and the mounting device 19, as well as spring elements 18 and power transistors 11. The connections of the power transistors 11 are then plated through and soldered to the PCB 12.

Figure 3C:
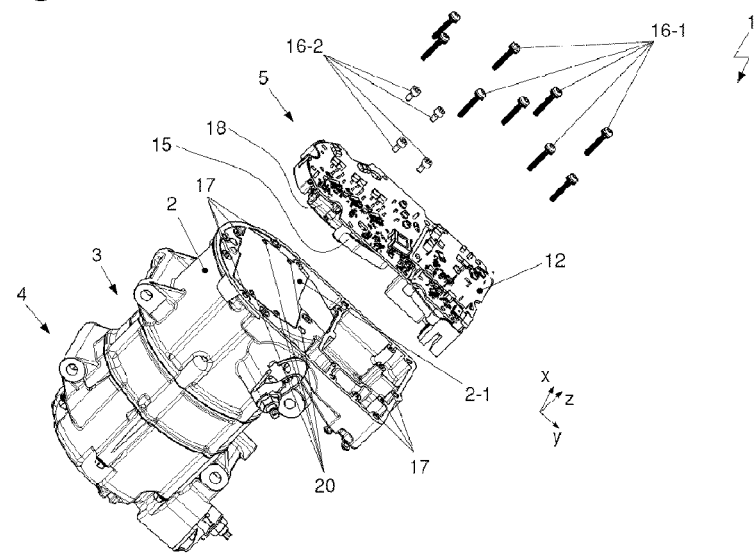

After soldering the power transistors 11 to the PCB 12, and thereby connecting the individual components, the premounted module is removed from the mounting device 19, wherein the first attachment elements 16-1 are in particular released. The premounted module is then attached to the housing 2, as shown in FIG. 3C. FIG. 3C shows a perspective exploded view of the PCB 12, the frame element 15 and the power transistors 11 of the inverter arrangement 5 when the premounted module is fitted, as well as the housing 2 of the electric motor 3 and of the compression mechanism 4 with a cooling surface 2-1. The premounted module is attached to the housing 2, in particular screwed down to the housing 2, using first attachment elements 16-1 that are guided through the openings produced in the PCB 12 and inserted into mounting holes 17 provided in the housing 2.

With its modular design, the arrangement 5 represents a coherent unit, comprising the listed components, which can then be connected directly to the compressor 1, in particular the housing 2 of the compressor 1. The frame element 5, which is aligned with the power transistors 11, themselves aligned with the cooling surface 2-1 of the housing 2 and soldered to the PCB 12, and attached to the spring elements 18 and the PCB 12, is premounted.

In an alternative process for mounting the arrangement 5 on the housing 2, all assembly steps are performed directly on the housing 2, in particular on the cooling surface 2-1 of the housing 2, instead of on the mounting device 19, as also shown in FIGS. 3A and 3B.

In the final step of the respective assembly process, the spring elements 18 are always attached to the cooling surface 2-1 of the housing 2, in particular screwed down to the housing 2 using the second attachment elements 16-2, in such a way that the spring elements 18 are elastically deformed and a spring force is generated and applied to the power transistors 11 in order to press the power transistors 11 against the cooling surface 2-1 of the housing 2. The spring elements 18 are attached to the cooling surface 2-1, in particular screwed down to the cooling surface 2-1, using second attachment elements 16-2 that are guided through the pass-through openings 18-3, each produced in the spring element 18, and inserted into mounting holes 20 that are provided in the cooling surface 2-1 of the housing 2.

Figure 4A:
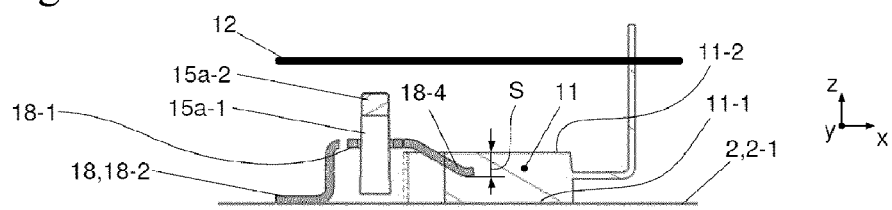
FIGS. 4A to 4C: A side view of an arrangement of a power transistor on the cooling surface of the housing relative to the PCB with a spring element in various mounting positions.
Figure 4B:
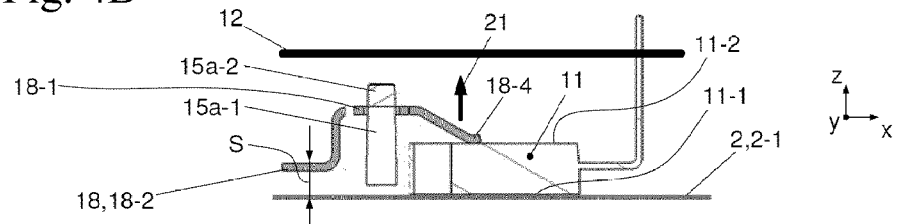
Figure 4C:
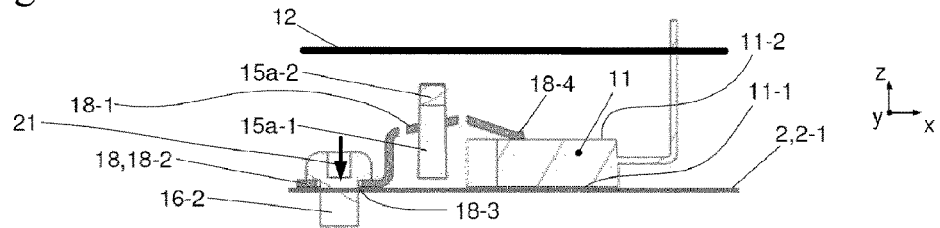

FIGS. 4A to 4C each show a side view of a power transistor arrangement 11 on the cooling surface 2-1 of the housing 2 in relation to the PCB 12 with a spring element 18 in various mounting positions.

The spring element 18 is arranged such that the mounting element 18-1 is placed over the snap-in element 15*a*-2 and onto the guide element 15*a*-1 on the frame element. A first surface 11-1 of the power transistor 11 is in contact with the cooling surface 2-1 of the housing 2. A second surface 11-2 of the power transistor 11, which is produced distally to the first surface 11-1, is aligned in the direction of the PCB 12.

FIG. 4A shows a comparative arrangement of an elastically undeformed spring element 18, whose base area 18-2 is in contact with the cooling surface 2-1, with the power transistor 11. An overlap of the contact area 18-4 of the spring element 18 relative to the second surface 11-2 of the power transistor 11 can clearly be seen here on the basis of a distance S that is aligned in the direction z.

During the process of soldering the connections of the power transistors 11 to the PCB 12, the elastically undeformed spring element 18 is arranged as per FIG. 4B such that it is slid along the guide element 15*a*-1 in a movement direction 21 that is aligned in the direction z, meaning that the solder points are free of any mechanical tension. The base area 18-2 of the spring element 18 is lifted off the cooling surface 2-1 by the distance S and its contact area 18-4 is in contact with the second surface 11-2 of the power transistor 11.

With the step of bringing the base area 18-2 into contact with the cooling surface 2-1, and thereby moving the base area 18-2 in the movement direction 21, as well as attaching the spring element 18 to the housing 2 using the second attachment elements 16-2, in particular screwing down the spring element 18 to the housing 2, as per FIG. 4C, the spring element 18 is elastically deformed and a spring force is thereby generated and applied to the power transistors 11. The spring force is applied via the contact area 18-4 and acts on the second surface 11-2, meaning that the first surface 11-1 of the power transistor 11, also classed as a heat transfer surface, in particular a surface for heat dissipation, is pressed against the cooling surface 2-1 of the housing 2 across its entire area.

The spring elements 18 are each arranged, in particular with the contact area 18-4, between the PCB 12 and the power transistors 11 in such a way that they apply a pressure on the power transistors 11. In particular, the strips of the spring elements 18 that are in contact with the power transistors 11 via the contact area 18-4 are elastically deformed. The compressive force generated by the spring elements 18 acts in the opposite direction to z towards the level of the cooling surface 2-1. The connections of the power transistors 11 to the PCB 12, in particular the solder points, remain free of any mechanical tension.

The spring elements 18 exhibit a defined stiffness. When mounting the inverter arrangement 5 to the housing 2, a force that essentially acts in the axial direction of the device 1, in particular a spring force, is produced between the respective spring element 18 and each power transistor 11, and thereby also the cooling surface 2-1 of the housing 2, such that each power transistor 11 is pressed in the direction of the housing 2 as a result of the elastic properties of the spring element 18. The force acts on the power transistor 11 when the power transistor 11 is placed in contact with the housing 2 and the spring element 18 is elastically deformed. Mechanical tension is thereby generated via the elastic deformation of the spring elements 18 following the process of mounting the arrangement 5 to the housing 2.

The spring elements 18 are configured in such a way that the power transistors 11 are pressed against the cooling surface 2-1 with a sufficient and predetermined force throughout the entire service life of the device 1, regardless of the ambient temperature inside the device 1.

Figure 5A:
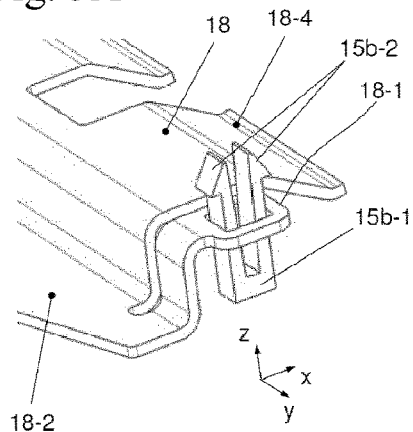
FIGS. 5A and 5B: A perspective view and sectional view of a first alternative embodiment of a guide element produced on the frame element for guiding a spring element in connection with the spring element.
Figure 5B:
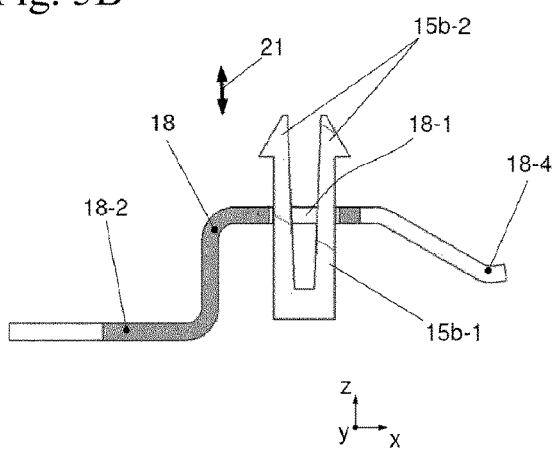
Figure 6A:
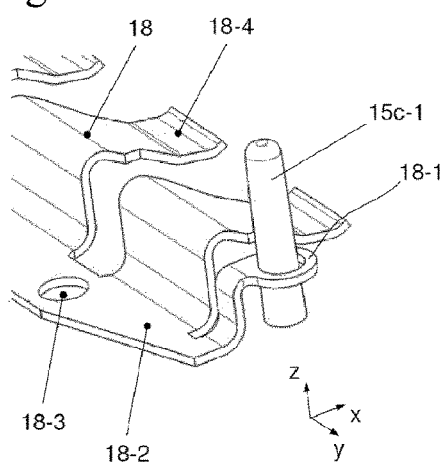
FIGS. 6A and 6B: A perspective view and sectional view of a second alternative embodiment of a guide element produced on the frame element for guiding a spring element in connection with the spring element.
Figure 6B:
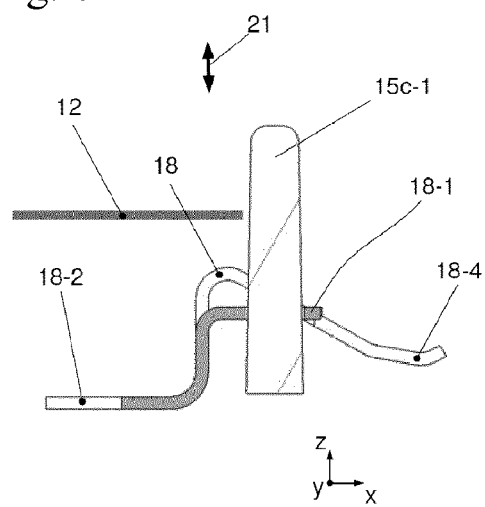

FIGS. 5A and 5B, as well as FIGS. 6A and 6B show a perspective view and sectional view of an alternative embodiment of a guide element 15*b*-1, 15*c*-1 produced on the frame element 15 for guiding the spring element 18 in the movement direction 21 in connection with the spring element 18.

The first alternative embodiment of the guide element 15*b*-1 as per FIGS. 5A and 5B exhibits an elongated form that extends in the direction z and is, in contrast to the guide element 15*a*-1 as shown in the figures described above, produced as an expansion element with two snap-in elements 15*b*-2. The guide element 15*b*-1 has a U-shape in the cross-section of the plane defined by the directions x and z and is thereby produced with two legs, which are connected to one another on a first end via a bridge. The legs exhibit a rectangular cross-section in the plane defined by the directions x and y.

As a component of the frame element (not shown), the guide element 15*b*-1 is firmly and inseparably, in particular not non-destructively, attached to the frame element via the bridge. The guide element 15*b*-1 exhibits one snap-in element 15*b*-2 on each of the free second ends that are produced distally to the first ends. The snap-in elements 15b-2 themselves are produced with a shape that is similar to a barb in such a way that the spring element 18 can be attached via the second ends and the process of attaching the spring element 18 is simplified thanks to a cross-sectional area that narrows towards the second end, as well as in a way that any movement beyond a predefined range in the opposite direction to the movement direction used when attaching them is prevented after being attached via the snap-in elements 15b-2. The gap produced between the legs of the guide element 15b-1 also facilitates elastic deformation of the legs towards one another and with the snap-in elements 15b-2 in the direction x, which also serves to further support the process of attaching the spring element 18. After being attached via the snap-in element 15b-2, the spring element 18 is then arranged on the guide element 15a-2 in such a way that it is captive and can move along the guide element 15b-1.

Like the spring element 18 from the figures described above, the strip-shaped mounting element 18-1 of the spring element 18 is attached to the base area 18-2 on its first end, while the second free end exhibits the shape of an eyelet, in particular a closed eyelet with a fully enclosed opening. In contrast to the spring element 18 from the figures described above, however, the opening is preferably produced with an essentially rectangular cross-section.

The second alternative embodiment of the guide element 15c-1 as per FIGS. 6A and 6B exhibits an elongated form that extends in the direction z, in particular a conical form of a pin, and is, in contrast to the guide element 15a-1 as shown in the figures described above, produced without a snap-in element. The guide element 15c-1 exhibits a circular cross-section in the plane defined by the directions x and y. As a component of the frame element (not shown), the guide element 15c-1 is also firmly and inseparably, in particular not non-destructively, attached to the frame element.

While the free second ends of the guide elements 15a-1, 15b-1 from FIGS. 2 to 5 are preferably arranged below the PCB 12 in the direction z, the guide element 15c-1 projects beyond the PCB 12 in the direction z with its free second end. The process of attaching the spring element 18 onto the guide element 15c-1 is simplified thanks to the conical shape, wherein the cross-sectional area narrows towards the second end, as well as the fact that any movement beyond a predefined range in the opposite direction to the movement direction used when attaching the element is prevented due to the arrangement of the PCB 12 as a stop for the spring element 18. After being attached to the guide element 15c-1, the spring element 18 is then captive and arranged such that it can move along the guide element 15c-1.

The first end of the strip-shaped mounting element 18-1 of the spring element 18 is attached to the base area 18-2, while its second free end is produced in the form of an eyelet, in particular a closed eyelet with a fully enclosed opening, specifically with a circular cross-section.

Figure 7A:
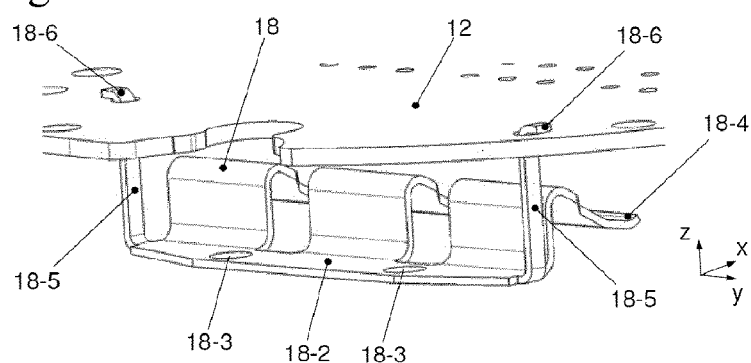
FIGS. 7A and 7B: A perspective view and sectional view of a third alternative embodiment of a guide element for guiding a spring element in connection with the spring element.
Figure 7B:
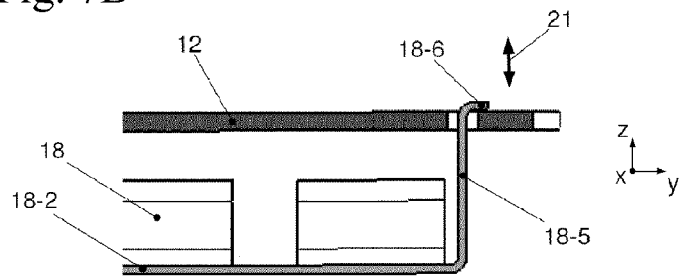

FIGS. 7A and 7B show a perspective view and sectional view of a third alternative embodiment of a guide element 18-5 for guiding the spring element 18 in connection with the spring element 18.

The guide elements 18-5 each exhibit an elongated form that extends in the direction z, in particular a strip form, and, in contrast with the guide elements 15a-1, 15b-1, 15c-1 from the figures described above, are produced on the spring element 18. The guide elements 18-5 are attached to the spring element 18 on a first end, in particular to the base area 18-2 of the spring element 18. The guide elements 18-5 each exhibit a snap-in element 18-6 on a free second end that is produced distally to the first end. The snap-in element 18-6 itself is produced with a shape that is similar to a barb with elastic deformability in a way that allows the spring element 18 to be inserted through a hole produced in the PCB 12 and thereby through the PCB 12 with its second end in a first movement direction, which runs in the direction z. The snap-in element 18-6 is preferably produced as an end of the strip that is bent over, in particular bent over by around 90°.

When inserting the guide element 18-5 through the PCB 12, leading with the snap-in element 18-6, the guide element 18-5 is elastically deformed. The elastic deformation causes the snap-in element 18-6 to snap into position on the PCB 12, thereby preventing the snap-in element 18-6 from moving beyond a predefined range in a second movement direction, which runs opposite to the first movement direction, which itself runs opposite to the direction z. The snap-in element 18-6 can therefore only be moved in the direction of the second movement direction until the snap-in element 18-6 is resting against the PCB 12, which serves as a stop. After being captively attached to the PCB 12, the spring element 18 is then arranged such that it can move along the guide element 18-6 in the movement direction 21.

When using an arrangement of the inverter with the guide elements 18-5 produced on the spring element 18, it is possible to dispense with the frame element. During the process of mounting the inverter arrangement, the power transistors 11, as well as the PCB 12 with the already premounted spring elements 18, are set down onto the mounting device 19 or the housing 2 one after the other in the specified sequence. The spring elements 18 are secured on the PCB 12 in such a way that a relative movement of the spring elements 18 in the direction z, and thereby in the direction of the force that will act on the power transistors 11 when fitted, is guaranteed until the spring elements 18 are attached, in particular screwed down, to the mounting device 19 or the housing 2. The spring elements 18 are not elastically deformed, meaning that no spring force is generated, until the spring elements 18 are screwed down to the mounting device 19 or the housing 2.

After setting down the power transistors 11 onto the mounting device 19 or the cooling surface 2-1 of the housing 2, the PCB 12 with the spring elements 18 is moved relative to the power transistors 11 in such a way that the connections of the power transistors 11 are inserted through openings produced in the PCB 12 free of any mechanical tension. The spring elements 18 are slid along the guide elements 18-5 in the direction z. The PCB 12 is attached to the mounting device 19 or the housing 2, in particular screwed down using the first attachment elements 16-1, with the spring elements 18 and power transistors 11 arranged between the PCB 12 and the mounting device 19 or the housing 2. The connections of the power transistors 11 are then plated through and soldered to the PCB 12.

If the arrangement of the inverter was premounted with the mounting device 19, the premounted module is removed from the mounting device 19 after soldering the power transistors 11 to the PCB 12, and thereby connecting the individual components, wherein the first attachment elements 16-1 are in particular released. The premounted module is then attached to the housing 2. The premounted module is attached to the housing 2, in particular screwed down to the housing 2, using first attachment elements 16-1 that are guided through the openings produced in the PCB 12 and inserted into mounting holes 17 provided in the housing 2.

Once this has been completed, or if the inverter arrangement is to be mounted directly to the housing 2, the spring elements 18 are attached to the cooling surface 2-1 of the housing 2, in particular screwed down to the housing 2 using the second attachment elements 16-2, in such a way that the spring elements 18 are elastically deformed and a spring force is generated and applied to the power transistors 11 in order to press the power transistors 11 against the cooling surface 2-1 on the housing 2. The spring elements 18 are attached to the cooling surface 2-1, in particular screwed down to the cooling surface 2-1, using second attachment elements 16-2 that are guided through the pass-through openings 18-3, each produced in the spring element 18, and inserted into mounting holes 20 that are provided in the cooling surface 2-1 of the housing 2.

The present invention relates to a device, in particular an electric motor, for driving a compressor to compress a vaporous fluid, specifically a refrigerant. The device is produced with a housing that features a cooling surface and a power supply arrangement. The arrangement exhibits at least one switching element, a PCB, as well as a spring element for applying a spring force on the switching element. The switching element is connected to the PCB. The compressor can be used in the refrigerant circuit of a motor vehicle air-conditioning system. The present invention also relates to processes for mounting the device used to drive the compressor of a vaporous fluid.

The invention claimed is:

1. A device (3) for driving a compressor of a vaporous fluid comprising:
   a housing with a cooling surface and power supply arrangement with at least one switching element;
   at least one PCB; and
   at least one spring element for applying a spring force onto the at least one switching element, wherein the at least one switching element is connected to the PCB, and the cooling surface and the PCB are arranged relative to one another in a direction z with spacing, wherein the at least one switching element is arranged such that it is in contact with the housing with a first surface in an area of the cooling surface and that the at least one spring element for pressing the at least one switching element against the cooling surface is in contact with a second surface of the at least one switching element, wherein the PCB and the at least one spring element are produced such that they can be attached to the housing independently of one another using fixings and the at least one spring element can be arranged between the PCB and the cooling surface on at least one guide element in such a way that it can be moved freely along a movement direction.

2. The device according to claim 1, wherein the at least one guide element is produced as a component of a frame element arranged between the cooling surface of the housing and the PCB or as a component of the at least one spring element.

3. The device according to claim 2, wherein the frame element is produced with pass-through openings for guiding through the fixings for connection to the housing.

4. The device according to claim 2, wherein the frame element is produced with at least one mounting recess for mounting the at least one switching element.

5. The device according to claim 2, wherein the frame element is produced with feed-through openings for inserting connections of the at least one switching element.

6. The device according to claim 2, wherein the frame element is constructed from a plastic.

7. A process for mounting the device to drive the compressor of the vaporous fluid according to claim 2, exhibiting the following steps:

mounting of the power supply arrangement to the housing of the device or, as a module, to a mounting device with arrangement of the at least one switching element with the first surface on the cooling surface of the housing or on the mounting device, wherein connections of the switching element project beyond the at least one switching element in the direction z and beyond the second surface of the at least one switching element that points in an opposing direction to the first surface, wherein the direction z is aligned essentially orthogonally to the cooling surface and the first surface and the second surface of the at least one switching element, arrangement of the at least one spring element on the frame element, such that the at least one spring element can be moved in the direction z on the at least one guide element in a guided fashion in the movement direction relative to the frame element, arrangement of the frame element with the at least one spring element in the direction z in such a way that the at least one switching element is arranged between the cooling surface and the frame element, wherein the at least one spring element is placed into contact with a contact area on the second surface of the at least one switching element and is moved in the direction z along the at least one guide element in a sliding motion without any elastic deformation, arrangement of the PCB on the frame element in the direction z, insertion of the connections of the at least one switching element through openings produced in the PCB, fixing of the PCB to the housing, in particular to the cooling surface, or to the mounting device using first attachment elements, soldering of the connections of the at least one switching element to the PCB free of any mechanical tension and connecting components to produce a module, when mounting the power supply arrangement to the mounting device as a module, release of the first attachment elements and removal of the module from the mounting device, as well as arrangement of the module on the housing with the first surface of the switching element on the cooling surface, as well as fixing the PCB to the housing using the first attachment elements, as well as fixing of the spring element with a base area on the cooling surface using second attachment elements, wherein the at least one spring element is elastically deformed and a spring force acting on the at least one switching element is generated in such a way that the at least one switching element is pressed against the cooling surface in the direction z.

8. The process according to claim 7, wherein the spring element is attached to the at least one guide element of the frame element with a mounting element, in particular produced as an eyelet, in the movement direction.

9. The process according to claim 8, wherein the mounting element is snapped into place captively with the guide element of the frame element on a snap-in element.

10. The process according to claim 7, wherein the frame element is placed over the at least one switching element in such a way that the connections of the at least one switching element is guided through feed-through openings produced in the frame element in the direction z, projecting out of the frame element, and the at least one switching element is arranged and integrated inside mounting recesses produced in the frame element.

11. A process for mounting the device to drive the compressor of the vaporous fluid according to claim 2, exhibiting the following steps:
   mounting of the power supply arrangement to the housing of the device or, as a module, to a mounting device with arrangement of the at least one switching element with the first surface on the cooling surface of the housing or on the mounting device, wherein connections of the at least one switching element project beyond the at least one switching element in the direction z and beyond the second surface of the at least one switching element that points in an opposing direction to the first surface, wherein the direction z is aligned essentially orthogonally to the cooling surface and the first surface and the second surface of the at least one switching element,
   arrangement of the at least one spring element on the PCB, so that the at least one spring element can be moved in the direction z in a guided way in the movement direction relative to the PCB on the at least one guide element,
   arrangement of the PCB with the at least one spring element aligned in the direction z in such a way that the at least one switching element is arranged between the cooling surface and the PCB, wherein the at least one spring element is brought into contact on a contact area with the second surface on the at least one switching element and is slid in the direction z along the at least one guide element without any elastic deformation,
   insertion of connections of the at least one switching element through openings produced in the PCB,
   fixing of the PCB to the housing, in particular to the cooling surface, or to the mounting device using first attachment elements,
   soldering of the connections of the at least one switching element to the PCB free of any mechanical tension and connecting components to produce a module,
   when mounting the power supply arrangement to the mounting device as a module, release of the first attachment elements and removal of the module from the mounting device, as well as arrangement of the module on the housing with the first surface of the at least one switching element on the cooling surface, as well as fixing the PCB to the housing using the first attachment elements,
   fixing of the at least one spring element with a base area on the cooling surface using second attachment elements, wherein the at least one spring element is elastically deformed and a spring force acting on the switching element is generated in such a way that the at least one switching element is pressed against the cooling surface in the direction z.

12. The process according to claim 11, wherein, when mounting the power supply arrangement as a module on the mounting device, the at least one spring element is attached to the mounting device on the base area using the second attachment elements before soldering the connections of the at least one switching element to the PCB, wherein the at least one spring element is elastically deformed and, in this way, a spring force is generated and applied to the at least one switching element such that the at least one switching element is pressed in the direction z against the mounting device and that the second attachment elements are released before removing the module from the mounting device.

13. The process according to claim 11, wherein the PCB and/or the at least one spring element are screwed down to the housing and/or to the mounting device using the first attachment element and the second attachment element.

14. The device according to claim 1, wherein the movement direction of the at least one spring element is aligned in the direction z vertically to a plane of the PCB and a plane of the cooling surface on the housing, wherein the planes of the PCB and the cooling surface are aligned and arranged parallel to one another with spacing.

15. The device according to claim 1, wherein the at least one guide element exhibits a shape that is elongated in the direction z with one first end and one second end.

16. The device according to claim 15, wherein the at least one guide element is connected to the frame when produced as a component of the frame element or to the at least one spring element by its first end when produced as a component of the at least one spring element.

17. The device according to claim 15, wherein the at least one guide element is produced with at least one snap-in element on its second end for locking the at least one spring element to the frame element when produced as a component of the frame element or with at least one snap-in element on its second end for locking the at least one spring element on the PCB when produced as a component of the at least one spring element.

18. The device according to claim 15, wherein the at least one guide element exhibits a rectangular or round cross-section with a plane formed vertically to the direction z or a U-shaped cross-section with an open side on the second end with a plane formed in a direction x or the direction z.

19. The device according to claim 1, wherein the at least one spring element exhibits a form of a small plate with at least one curved strip that projects from a base area.

20. The device according to claim 19, wherein a curvature of the at least one curved strip with a contact area produced as a convex surface is aligned in a direction of the at least one switching element and arranged such that it is contact with the contact area on the at least one switching element.

21. The device according to claim 19, wherein there are at least two switching elements and one strip of each of the at least one spring elements is assigned to each of the at least two switching element.

22. The device according to claim 19, wherein the at least one spring element is produced with at least one mounting element for connection to the at least one guide element or with the at least one guide element for connection to the PCB.

23. The device according to claim 22, wherein the at least one mounting element and/or the at least one guide element exhibits a shape of a strip with one first end and one second end, wherein the first end is connected to the base area.

24. The device according to claim 23, wherein the second end of the at least one mounting element is produced as a free end with an opening for passing through the guide element.

25. The device according to claim 23, wherein the second end of the at least one guide element is produced as a free end with a snap-in element for passing through an opening produced in the PCB.

26. The device according to claim 19, wherein the spring element exhibits pass-through openings produced in the base area for passing through attachment elements for connection to the housing.

27. The device according to claim 1, wherein the at least one spring element is produced from an elastically deformable material.

28. A use of the device to drive the compressor, in particular an electric motor, for compressing the vaporous fluid, according to claim 1 for the compressor of a refrigerant in a refrigerant circuit of a motor vehicle air-conditioning system.

\* \* \* \* \*